(12) United States Patent
Lam et al.

(10) Patent No.: US 8,605,497 B2
(45) Date of Patent: Dec. 10, 2013

(54) PARALLEL PROGRAMMING SCHEME IN MULTI-BIT PHASE CHANGE MEMORY

(75) Inventors: Chung H. Lam, Peekskill, NY (US); Jing Li, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 13/335,310

(22) Filed: Dec. 22, 2011

(65) Prior Publication Data

US 2013/0163322 A1    Jun. 27, 2013

(51) Int. Cl.
*G11C 11/00*    (2006.01)
(52) U.S. Cl.
USPC .......................................... 365/163; 365/158
(58) Field of Classification Search
USPC .................................... 365/163, 158
See application file for complete search history.

(56) References Cited

U.S. PATENT DOCUMENTS

| | | |
|---|---|---|
| 6,426,891 B1 | 7/2002 | Katori |
| 6,914,801 B2 | 7/2005 | Kostylev et al. |
| 7,332,735 B2 | 2/2008 | Campbell |
| 7,359,246 B2 | 4/2008 | Sforzin et al. |
| 7,391,642 B2 | 6/2008 | Gordon et al. |
| 7,417,900 B2 | 8/2008 | Rolandi et al. |
| 7,420,851 B2 | 9/2008 | Fasoli |
| 7,423,897 B2 | 9/2008 | Wicker |
| 7,486,536 B2 | 2/2009 | Kim et al. |
| 7,499,315 B2 | 3/2009 | Lowrey et al. |
| 7,515,459 B2 | 4/2009 | Kang et al. |
| 7,554,861 B2 | 6/2009 | Vimercati et al. |
| 7,567,473 B2 | 7/2009 | Breitwisch et al. |
| 7,602,632 B2 | 10/2009 | Breitwisch et al. |
| 7,606,055 B2 | 10/2009 | Liu |
| 7,626,858 B2 | 12/2009 | Happ et al. |
| 7,656,710 B1 | 2/2010 | Wong |
| 7,660,147 B2 | 2/2010 | Chao et al. |
| 7,663,137 B2 | 2/2010 | Campbell |
| 7,663,618 B2 | 2/2010 | Svensson et al. |

(Continued)

FOREIGN PATENT DOCUMENTS

EP    0 626 758 A2    11/1994

OTHER PUBLICATIONS

G.W. Burr et al., "Phase change memory technology," Journal of Vacuum Science & Technology B: Microelectronics and Nanometer Structures, vol. 28, No. 2, Mar./Apr. 2010, pp. 223-262.

(Continued)

*Primary Examiner* — Michael Tran
(74) *Attorney, Agent, or Firm* — Scully, Scott, Murphy & Presser, P.C.; Daniel P. Morris, Esq.

(57) ABSTRACT

A system, a method for parallel programming multiple bits of a phase change memory array for high bandwidth. The system and method includes parallel programming scheme wherein a common wordline (WL) is driven with a first pulse of one of: gradually increasing (RESET) or decreasing (SET) amplitudes which control current flow through one or more phase change memory cells associated with the WL. Simultaneously therewith, one or more bitlines (BLs) are driven with one or more second pulses, each second pulse more narrow than that of the first pulse applied to the WL. The starting time of the one or more second pulses may vary with each bitline driven at a time later than, but within the window of the wordline pulse to achieve a programming current suitable for achieving the corresponding memory cell state.

18 Claims, 7 Drawing Sheets

(56) References Cited

U.S. PATENT DOCUMENTS

| | | |
|---|---|---|
| 7,684,227 B2 | 3/2010 | Liu et al. |
| 7,696,077 B2 | 4/2010 | Liu |
| 7,729,163 B2 | 6/2010 | Ramani et al. |
| 7,745,231 B2 | 6/2010 | Liu et al. |
| 7,754,522 B2 | 7/2010 | Liu |
| 7,755,939 B2 | 7/2010 | Tamada |
| 7,796,424 B2 | 9/2010 | Happ et al. |
| 7,817,475 B2 | 10/2010 | Lowrey |
| 7,929,338 B2 | 4/2011 | Franceschini et al. |
| 2007/0029537 A1 | 2/2007 | Campbell |
| 2007/0034905 A1 | 2/2007 | Elkins |
| 2007/0121364 A1 | 5/2007 | Bertin et al. |
| 2007/0158631 A1 | 7/2007 | Daley et al. |
| 2007/0268742 A1 | 11/2007 | Liu |
| 2008/0014733 A1 | 1/2008 | Liu |
| 2008/0044632 A1 | 2/2008 | Liu et al. |
| 2008/0062752 A1 | 3/2008 | Giovinazzi et al. |
| 2008/0142773 A1 | 6/2008 | Campbell |
| 2008/0258125 A1 | 10/2008 | Liu et al. |
| 2008/0298113 A1 | 12/2008 | Liu et al. |
| 2008/0298114 A1 | 12/2008 | Liu et al. |
| 2009/0196095 A1 | 8/2009 | Liu |
| 2009/0213653 A1 | 8/2009 | Perlmutter et al. |
| 2009/0244961 A1 | 10/2009 | Ramani et al. |
| 2009/0303785 A1 | 12/2009 | Hwang et al. |
| 2010/0008163 A1 | 1/2010 | Liu |
| 2010/0020594 A1 | 1/2010 | De Sandre et al. |
| 2010/0028421 A1 | 2/2010 | Cumming et al. |
| 2010/0034016 A1 | 2/2010 | Liu |
| 2010/0110779 A1 | 5/2010 | Liu et al. |
| 2010/0144087 A1 | 6/2010 | Ha et al. |
| 2010/0214830 A1 | 8/2010 | Franceschini et al. |
| 2010/0283029 A1 | 11/2010 | Dennison et al. |
| 2011/0063902 A1* | 3/2011 | Lung .................. 365/163 |
| 2011/0292749 A1* | 12/2011 | Park .................. 365/203 |
| 2011/0305074 A1* | 12/2011 | Lung et al. ........... 365/163 |
| 2012/0051123 A1* | 3/2012 | Liu .................... 365/163 |
| 2012/0248399 A1* | 10/2012 | Sasago et al. .......... 257/4 |

OTHER PUBLICATIONS

S. Kostylev et al., "Drift of programmed resistance in electrical phase change memory devices," Proc. E*PCOS 2008, Prague, 2008, pp. 117-124.

D.-H. Kang et al., "Two-bit Cell Operation in Diode-Switch Phase Change Memory Cells with 90nm Technology," Symposium on VLSI Technology, 2008I pp. 98099.

Y.-H. Chiu et al., "Impact of Resistance Drift on Multilevel PCM Design,"IC Design and Technology, ICICDT, 2010, pp. 20-23.

International Search Report and Written Opinion mailed Feb. 8, 2013 in PCT/US 12/66575.

* cited by examiner

PARALLEL PROGRAMMING SCHEME IN MULTI-BIT PHASE CHANGE MEMORY

BACKGROUND

The present disclosure relates to semiconductor memory devices, and methods of operating memory devices. More particularly, there is described, a method of programming arrays of phase change memory cells for high bandwidth.

A Phase Change Memory (PCM) cell includes a memory element of a phase change material having a first state, in which the phase change material is fully crystalline and has a minimum resistance level, a second state in which the phase change material is fully amorphous and has a maximum resistance level, and a plurality of intermediate states, in which the phase change material includes a mixture of both crystalline regions and amorphous regions having intermediate resistance values.

As known, the amorphous phase of a PCM tends to have high electrical resistivity, while the crystalline phase exhibits a low resistivity, e.g., orders of magnitude lower. Due to this large resistance contrast, the change in sensing signal between fully crystalline state and fully amorphous state is quite large, permitting for the immediate multiple analog levels needed for multi-level cell (MLC) operations.

In a PCM cell reset operation, a larger electrical current is applied in order to melt the central portion of the cell, and if this pulse is terminated abruptly, the molten material quenches into the amorphous phase, producing a cell in the high-resistance state. The reset operation tends to be fairly current and power hungry, and thus care must be taken to choose an access device capable of delivering high current and power without requiring a significantly larger footprint than the PCM element itself.

The read operation of a PCM cell is performed by measuring the device resistance at low voltage so that the device state is not perturbed.

Typical semiconductor computer memories are fabricated on semiconductor substrates consisting of arrays of large number of physical memory cells. In general, one bit of binary data is represented as a variation of a physical or electrical parameter associated with a memory cell. Commonly used physical/electrical parameters include a threshold voltage, Vth, variation of Metal Oxide Field Effect Transistor (MOSFET) due to the amount of charge stored in a floating gate or a trap layer in nonvolatile Electrically Erasable Programmable Read Only Memory (EEPROM), or resistance variation of the phase change element in Phase-change Random Access Memory (PRAM).

Increasing the number of bits to be stored in a single physical semiconductor memory cell is an effective method to lower the manufacturing cost per bit. Multiple bits of data can also be stored in a single memory cell when variations of the physical parameter can be associated with multiple bit values. This multiple bits storage memory cell is commonly known as a Multi-Level Cell (MLC). Significant amount of effort in computer memory device and circuit designs is devoted to maximize the number of bits to be stored in a single physical memory cell. This is particularly true with storage class memory, e.g., non-volatile Flash memories commonly used as mass storage devices.

Figure 2:
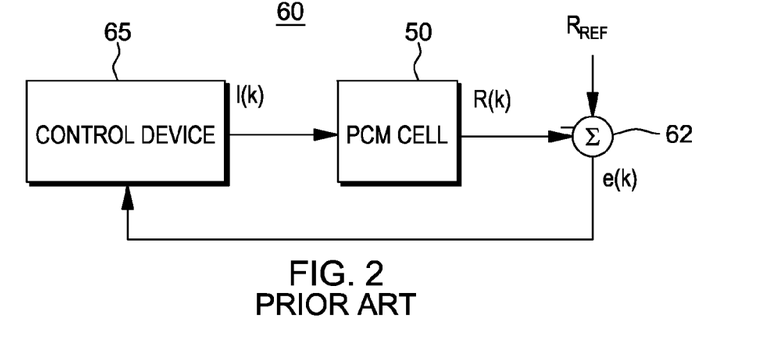
FIG. 2 illustrates an example schematic of an iterative write methodology implemented for adaptively controlling the amplitude of each PCM cell programming pulse as a sequence of write-verify steps.

FIG. 2 illustrates an example of iterative write system and methodology implemented for adaptively controlling the amplitude of each programming pulse in a sequence of write-verify steps. That is, in a prior art methodology 60, to achieve multiple resistance levels in a PCM cell 50, there is applied an adaptive algorithm 65 programmed to provide current pulse governed according to formula 1) as follows:

$$I(k+1)=I(k)+\alpha \cdot e(k) \quad \quad 1)$$

where I( ) is the applied current for programming each bit, k is the number of the iterations for multi-level cell programming. In FIG. 2, R(k) is a sensed parameter value, e.g., sensed resistance value, determined after application of programmed current pulse, $R_{REF}$ is a reference value of a parameter (e.g., a desired Resistance level) value e(k) is a error correction term representing a difference 62 between the programmed (desired) resistance value for the current PCM bit R(k) and the actual determined resistance value R(k) as a result of the pulse application in the current iteration. This error correction term is weighted by a value $\alpha$ and fed back to the adaptive algorithm 65 to reduce the number of iterations to achieve target resistance values among the PCM cells as governed according to formula 1).

Figure 3A:
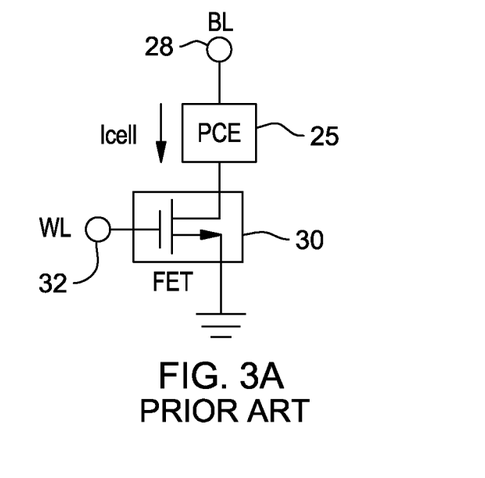
FIG. 3A depicts a schematic of an example PCM cell 25 subject to programming via the sequence of write-verify steps implemented according to an iterative write methodology of FIG. 2.
Figure 3B:
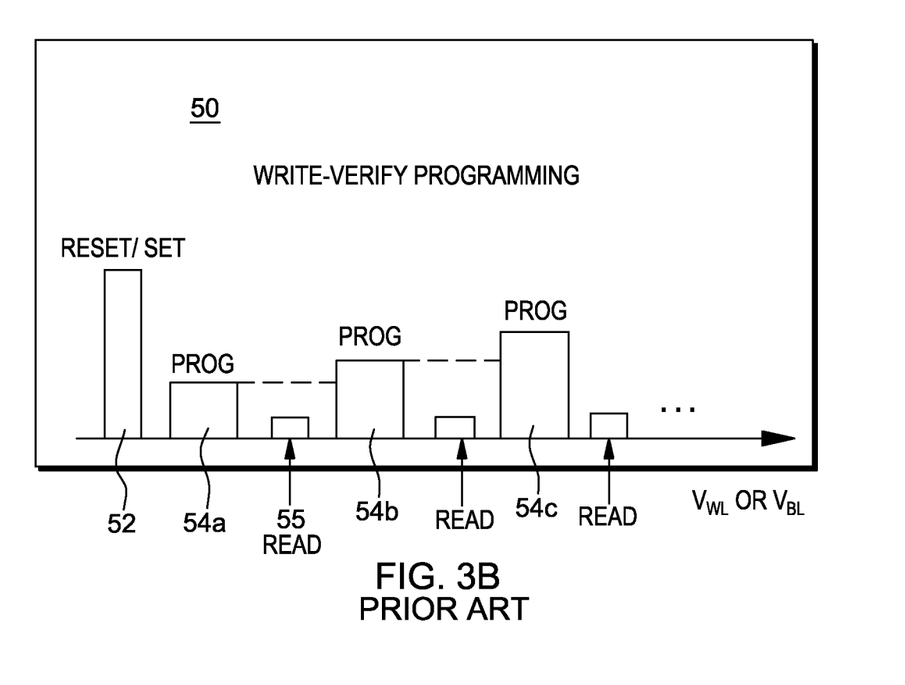
FIG. 3B shows an example diagram 50 depicting a plot of the pulses applied to one of the WL or BL implemented to program a single value in a single PCM cell according to a prior art write-verify methodology.

FIG. 3A particularly depicts a prior art operation of a write-verify sequence 50 for physical programming of bit values (e.g., analog states) into a PCM cell 25. As shown, the PCM cell 25 includes a bit line terminal 28 and a control access device (e.g., a transistor) 30 including one transistor terminal (e.g., source or drain) connecting the PCM and a transistor gate providing a second or wordline terminal 32. In one embodiment, voltage present at the wordline (WL) terminal 32 in the manner as shown in FIG. 3B, configures the control access device, e.g., transistor 30, to control current flow through the PCM cell as it is being programmed. In the operation of the iterative write system and methodology implemented for adaptively controlling the amplitude of each programming pulse in a write-verify sequence 50, the voltage at the wordline is first SET/RESET by application of a pulse 52 to place the cell in an initial state and, with the bitline terminal held at a constant voltage, a next pulse 54a is injected at the WL terminal 32 that is immediately followed by a read operation 55 for reading in the programmed PCM cell value resulting from the application of signal 54a injected at the wordline terminal. Referring back to FIG. 2 the read value is evaluated according to the programmed reference parameter value, e.g., a programmed reference resistance state ($R_{ref}$), and the calculated difference (e.g., error) is processed and fedback to a signal generator to provide a next pulse value shown as 54b for application to the WL terminal 32 immediately followed by a read operation 55 for reading in the programmed PCM cell value resulting from the application of signal 54b injected at the wordline terminal. If, as evaluated by processing after a read operation 55, the intended programmed reference resistance state ($R_{ref}$) is not achieved, then, based on the error difference, further steps may be employed to apply a next calculated WL pulse 54c for injected at the WL terminal 32 immediately followed by the read operation 55 for reading in the programmed PCM cell value resulting from the application of signals 54c and verifying whether the programmed resistance value had been achieved. The write-verify iterative process continues executing these steps until the programmed target ($R_{ref}$) parameter value, e.g., resistance, for that cell (or bit) has been reached.

It should be understood that, in the embodiment depicted in FIGS. 3A, 3B, the pulse voltages 54a, 54b, etc., can be applied to the PCM cell WL terminal 32 (while keeping the voltage at BL terminal 28 constant) or the pulse voltages 54a, 54b, etc., can be applied to the PCM BL terminal 28 while keeping voltage at the WL terminal 32 constant. In either application, for each iteration, the state of the memory cell is always initialized, making it highest R (e.g., fully RESET the cell) or making it lowest R (e.g., fully SET the cell), then perform iterative programming-verify operation.

Figure 1:
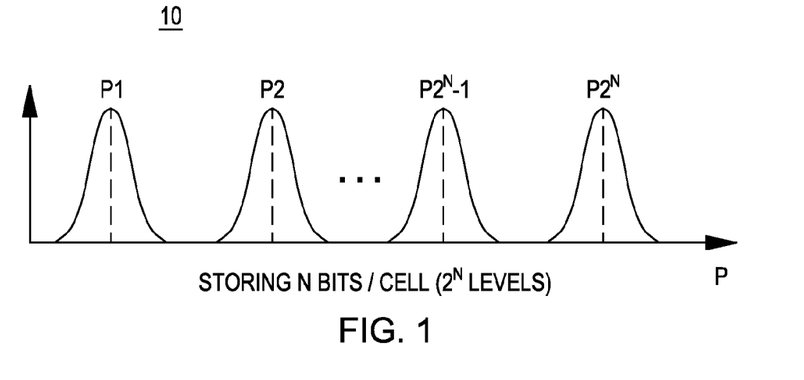
FIG. 1 shows an example multiple bit storage programming method for a PCM memory cell wherein the number of bands required for an n-bit cell is $2^n$.

The basic requirement for multiple bit storage in a semiconductor memory cell is to have the spectrum of the physical parameter variation to accommodate multiple non-overlapping bands of values. As shown in FIG. 1, the number of bands required for an n-bit cell is $2^n$. A 2-bit cell needs 4 bands, a 3-bit cell needs 8 bands, and so forth. Thus, the available spectrum of a physical or electrical parameter in a semiconductor memory cell is typically the limiting factor for multiple bit memory storage.

In addition to the limiting spectrum width, the ability for a memory controller or memory device to program a characteristic parameter (e.g., resistance) in a memory cell diminishes as the number of levels in a memory cell increases. Factors such as electrical noise, sense voltage disturbance, and spectrum width all interfere with the accuracy of a characteristic parameter value read from a memory cell.

It is desirable to devise a method to program a characteristic parameter to many distinct levels, while minimizing the perturbation to the parameter during write processes involving the memory cells.

It is further desirable to provide a system and method for simultaneously programming a plurality of phase change memory cells in an array of memory cells for achieving very high bandwidth, wherein a variation of the characteristic parameter of the memory cell determines the state of the memory cell.

SUMMARY

A system and method for simultaneously programming a plurality of phase change memory cells in an array of memory cells, wherein a variation of the characteristic parameter of the memory cell determines the state of the memory cell.

According to one embodiment, multiple phase change memory cells sharing a common word line are programmed in a parallel fashion whence a voltage pulse applied to the word line is ramped; programming pulses of variable amplitude, width and trailing edge are applied to the bit line at variable time interval during the ramp of the word line pulse thus achieving multi-bit parallel programming.

Thus, in one aspect, there is provided a system and method for programming a plurality of phase change memory (PCM) cells, each the memory cell of the plurality of cells being programmed having a respective first and second terminal, and each respective the first terminal of each the memory cell coupled to a common conductor. The method comprises: applying, via the common conductor, a first signal of a defined time duration, to the first terminal of each respective memory cell of the plurality of memory cells being programmed; and, applying, during the defined time duration, one or more second pulse signals at each respective second terminal of each respective memory cell of the plurality of memory cells being programmed, wherein each application of the first signal and the one or more second pulse signals at respective the first and second memory cell terminals during the defined time duration configuring a target characteristic parameter to achieve one or more programmed states at the respective memory cell.

Further, there is provided a system for parallel programming a bit value in each of a plurality of phase change memory (PCM) cells, each individual PCM memory cell having first and second terminals, wherein the first terminals of the plurality of cells couple to a common conductor, and each the second terminals of the plurality of cells couple to an associated individual conductor. The system comprises: a first signal generator device for applying, via the common conductor, a first signal of a defined time duration, to the first terminal of each respective memory cell of the plurality of memory cells being programmed; and, a second signal generator device for applying, during the defined time duration, one or more second pulse signals at each respective second terminal of each respective memory cell of the plurality of memory cells being programmed via respective associated individual conductors, wherein each application of the first signal and the one or more second pulse signals at respective the first and second memory cell terminals during the defined time duration configure a target characteristic parameter to achieve a one or more programmed states at the respective memory cell.

Advantageously, the system and method of parallel programming of a Multi-Level PCM memory cell implements an iterative write-verify programming technique that enables reading of a characteristic parameter after the programming for verification. The iterative write-verify programming technique provides the ability to maximize the information storage capacity of each cell, i.e., increase the number of bits stored per cell.

BRIEF DESCRIPTION OF THE DRAWINGS

The present invention will be described with reference to FIG. 1-11. When referring to the figures, like elements shown throughout are indicated with like reference numerals.

DETAILED DESCRIPTION

A parallel programming apparatus and method for writing multiple bits to a multi-level PCM cell (MLC) more efficiently, is now described in connection with FIG. 4.

According to one embodiment, multiple phase change memory cells sharing a common word line are programmed in a parallel fashion whence the voltage pulse applied to the word line is ramped; programming pulses of variable amplitude, width, rising and/or trailing edge are applied to the bit line at variable time interval during the ramp of the word line pulse thus achieving multi-bit parallel programming.

Figure 4:
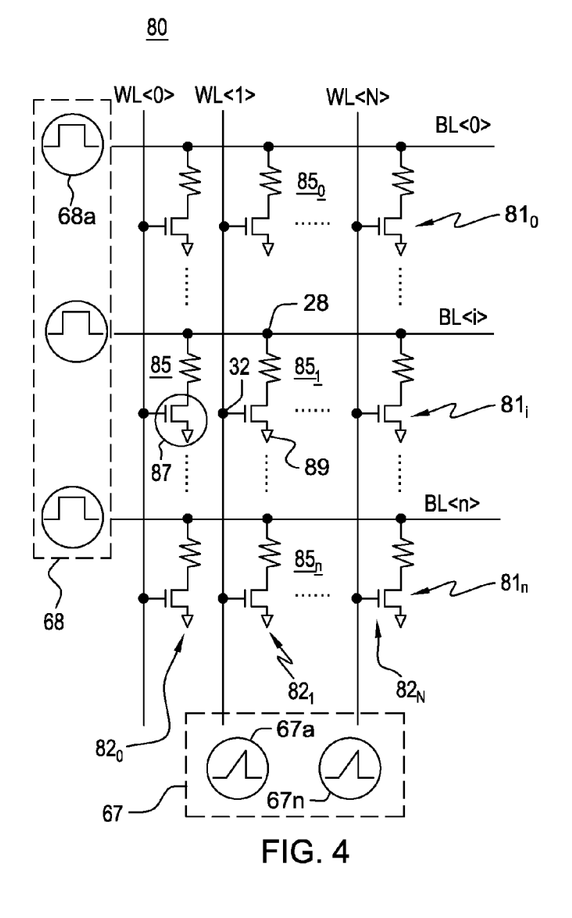
FIG. 4 particularly shows a memory apparatus 80 organized as a plurality of memory cells programmed in accordance with the parallel programming scheme.

FIG. 4 particularly shows a PCM cell memory array 80 formed and programmed in accordance with the parallel programming MLC scheme. As shown, formed in a semiconductor substrate, e.g., silicon, silicon-germanium or varieties of others, a plurality of structures including the programmable PCM cell elements 85 having formed cell access control device 87 (e.g., a transistor such as a FET/MOSFET) connected at one end using known semiconductor manufacturing lithographic masking, etching, and deposition techniques.

As shown in FIG. 4, each individual PCM memory cell 85 has first and second terminals, wherein the first terminals of the plurality of cells couple to a common WL conductor (e.g., WL<0>, WL<1>, . . . , WL<N>) and each of the second terminals of said plurality of cells couple to a respective individual BL conductor (e.g., BL<0>, BL<1>, . . . , BL<N>).

More particularly, each phase change material cell 85 includes a first WL terminal 32 that receives WL signal input(s) at the gate of its respective access control transistor 87 with its drain or source terminal connected to the PCM cell and the other (source or drain) terminal connected to ground or neutral voltage potential 89. Further, each phase change memory cell 85 includes a conductive bit line BL terminal 28 connected at other end to receive BL signal inputs. As described herein below, in one embodiment, each respective PCM cell 85 access control transistor 87 receiving a wordline WL signal at its gate terminal 32 is used to control the programming of PCM cell 85 by controlling current through the PCM cell 85. Particularly, in the parallel programming scheme described herein, there is performed application of WL signal(s) and simultaneous application of one or more BL pulse(s) that controls the programming of each cell 85 of one or more columns.

More particularly, in FIG. 4, the programmable PCM memory device 80 includes an array of PCM memory structures 85, and in an example non-limiting implementation, is organized as "n" rows $81_0$, $81_1$, $81_n$ and "N" columns $82_0$, $82_1$, $82_N$ of memory cells. For example, each respective structure 85 of a respective column, e.g., MLC structures $85_0$, $85_1$, . . . , $85_n$, is associated with a single formed electrically conductive wordline, e.g., wordline conductor WL<1>, and is connected at one end to the WL terminal 32 at the gate of transistor 87. Each structure MLC structures $85_0$, $85_1$, . . . , $85_n$ of each column are each connected at a respective row at a second terminal 28 to a respective associated electrically conductive bit line, e.g., bit lines BL(0), BL(1), . . . , BL(n) as shown in FIG. 4. Each PCM structure 85 is independently programmable; however, according to the parallel programming scheme, a plurality of multiple resistive states can be programmed at a time, i.e., MLC structures $85_0$, $85_1$, . . . , $85_n$ in one or more columns may be simultaneously programmed.

In such a scheme, as shown in FIG. 4, one or more WL signal generator devices indicated as a generator device 67 (e.g., including one or more programmable clock, pulse or ramp signal generators 67a, . . . 67n) are provided that can simultaneously apply a WL pulse for charging the respective one or more word lines (WL) of the PCM cells 85 being programmed during write-verify iterative programming, and one or more BL signal generator devices indicated as a generator device 68 (e.g., including one or more programmable clock, pulse or ramp signal generators 68a, . . . 68n) are provided that can simultaneously apply the BL pulse(s) to bit lines connecting the PCM cells 85 being programmed according to the write-verify programming algorithm that governs the application of WL and corresponding application of BL pulses for programming a plurality of cells in the array 80 as described herein.

Figure 5:
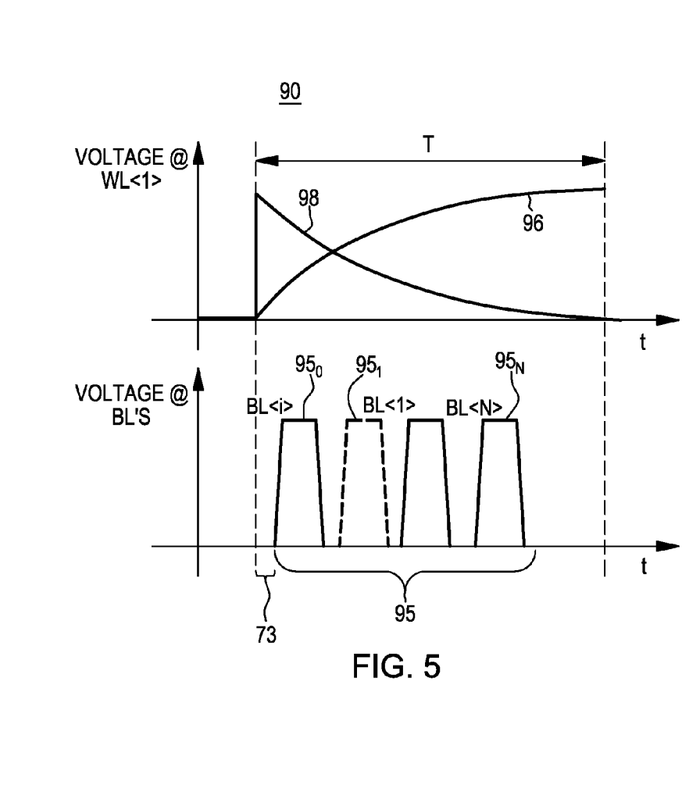
FIG. 5 shows a plot of applied voltages in the parallel programming method, each wordline pulse being slow ramping (e.g., slow rise time or slow fall time)

In the programming methodology, indicated as a schematic 90 shown in FIG. 5, a single WL voltage or current signal is applied while at a WL terminal while plural BL voltage or current signals are applied at respective bit lines. That is, FIG. 5 plots voltages directly applied to the WL and BL terminals of each plurality of PCM cells in the parallel programming method. As shown, each applied wordline signal 90 is slow ramping. For example, an applied WL signal can be a ramp signal 96 of slow rise time, i.e., WL signal of gradually increasing amplitude (e.g., 0V-2.5V) over a defined time duration "T" (e.g., about 10 μs in one example embodiment), or a ramp signal of slow fall time, i.e., WL signal of decreasing amplitude (2.5V-0V) over a defined time duration "T" (e.g., about10 μs). In a further aspect, as described in greater detail in commonly-owned, co-pending U.S. patent application Ser. No. 13/335,155, the whole contents and disclosure of which is incorporated by reference as if fully set forth herein, there is provided an efficient word line row driver which can generate slow ramping signals 96, 98 without consuming any significant power.

In one aspect, the parallel programming scheme is used to simultaneously program many cells that are connected on the same WL. Thus, for example, as shown in FIG. 5, a falling (or rising) pulse 98 (96) applied to a WL (e.g., WL<1>) having gradual decrease (or increase) in amplitude is applied for a time interval T. In one embodiment, the fall time or rise time is slow e.g., about a slew rate of ±0.25V/μs). As shown, the concurrent programming of the plural cells 85 connected to the WL<1>includes the concurrent application of a BL pulse(s) 95 at each BL of much shorter time duration (e.g., 10's ns) than WL's ramped signal duration (e.g., 10's μs), within the time duration "T". That is, as shown in FIGS. 4 and 5, to simultaneously program PCM cells $85_0$, $85_1$, . . . , $85_n$ during application of WL signal 96 or 98, a BL pulse 95(0), 95(1), . . . , 95(N) is concurrently applied at a respective bit line (e.g., bitlines BL(0), . . . BL(N)). In the embodiment depicted in FIG. 5, each applied BL pulse 95(0), 95(1), . . . , 95(N) is shown starting at different programmed time points depending upon the target parameter being programmed into the respective cell (i.e., resistance level) connected at the respective bit line. Generally, by changing a BL voltage or current pulse attribute, e.g., application of voltage start times within the WL turning-on time, various currents are achieved for programming different resistance levels (states).

In one embodiment, different BL's can be pulsed separately and/or simultaneously by generators 68a, . . . ,68n to realize parallel programming. A slow signal transition on WL terminal results in larger number of cells sharing the same row driver which improve bandwidth.

In a further aspect, the parallel programming scheme is used to simultaneously program plural cells 85 that are connected on multiple WLs in different array partitions 80. Thus, in other subarrays as array 80 shown in FIG. 4, a gradual falling (or rising) ramped pulse 98 (96) may be simultaneously applied by programmed generators 67 to a word line (e.g., WL<0>or WL<1>, . . . or WL<N>) for a time duration "T". The programming of the plural cells 85 connected to the common WL (either WL<0>, WL<1>, . . . , WL<N>) includes the concurrent application of one or more BL pulse(s) 95 at each BL (e.g., BL(0), BL(1), . . . , BL(n)) within the time duration T. That is, as shown in FIG. 5, signals 96 or 98 may be applied to respective PCM cells 85 at each of one or more WLs in different array partitions during application of WL signal 96 or 98, and one or more BL pulses 95(0), 95(1), . . . , 95(N) are concurrently applied at a respective bit line (e.g., bitlines BL(0), . . . BL(N)) in a manner dependent upon the target reference parameter being programmed into the cell (i.e., resistance level). By changing the pulse attributes of applied BL pulses, e.g., BL voltage starting times within the WL turning-on time, various currents are achieved for programming different resistance levels (states).

In one embodiment, to improve programming accuracy, iterative programming is applied to the parallel programming scheme. In one embodiment, as shown in FIG. 6, a modified iterative write-verify algorithm 100 is provided that governs the application of WL and corresponding application of BL pulses, for example, in order to achieve a target cell state, i.e., a characteristic parameter such as a target resistive state corresponding to a bit or binary value, for example.

Figure 6:
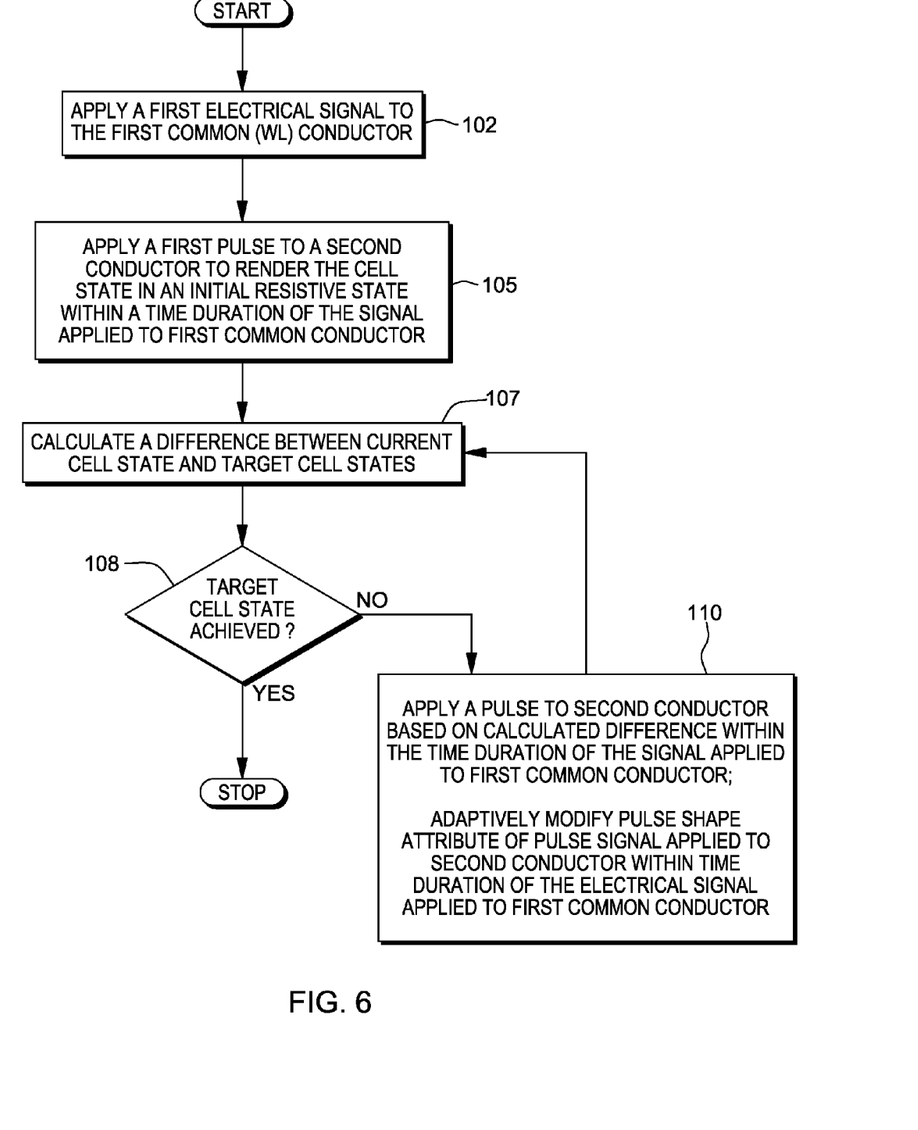
FIG. 6 illustrates a flow chart depicting the iterative write-verify programming methodology 100 for multi-level PCM cell parallel programming according to one embodiment.

As shown in FIG. 6, the modified iterative write-verify algorithm 100 is embodied to govern the applying of WL and corresponding application of BL pulses during parallel PCM cell programming to achieve specific PCM cell states.

At first step 102 there is first applied an electrical signal to a first common (WL) conductor. In one embodiment, the first electrical signal applied to the first common (WL) conductor includes a ramp of decreasing or increasing amplitude. For the case of programming PCM cells at multiple word lines, a first applied electrical signal is simultaneously applied to each of the plural WLs in different array partitions. Then, as indicated at step 105, a first pulse is applied to a second conductor (e.g., the BL conductors) to render each corresponding cells' state connecting that bit line in an initial resistive state within the time duration "T" of the WL signal applied to first common conductor.

Then, at step 107, for each cell, a reading operation is performed to ascertain the current cell state and a difference between current cell state and target cell state is calculated. Then, at 108 a determination is made as to whether the target cell state has been achieved. If the determined target cell state (e.g., cell resistance) has been achieved, then the algorithm terminates and exits the program or proceeds to further cell programming. Otherwise, if the determined target cell state (e.g., cell resistance) has not yet been achieved, then the write-verify algorithm continues to step 110 to adaptively adjust an attribute(s) of the next applied BL pulse.

Specifically, at step 110, within the time duration T of the first signal applied to the common WL conductor(s), the system adaptively modifies the pulse shape attribute of the next BL pulse signal applied to second BL conductor(s). Thus, if the target cell parameter has not been achieved after the read operation, a next pulse applied to the second (BL) conductor is based on calculated difference within the time duration of the signal applied to first common conductor, after which is conducted the read operation. The process will return to 107 in order to evaluate the programmed cell state by again calculating the difference between current cell state and target cell state, and the process including steps 108 and 110 repeats until a targeted cell characteristic parameter (e.g., programmed cell resistance), has been achieved.

Figure 7:
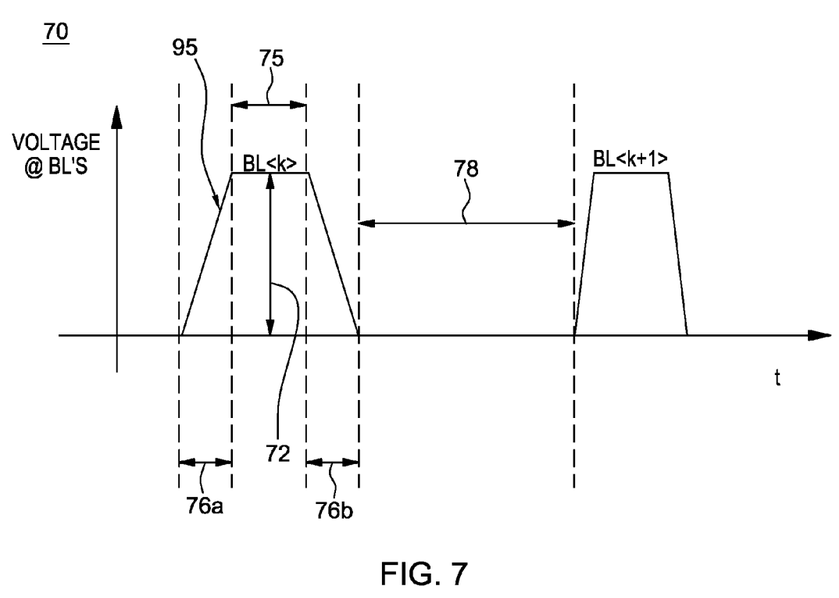
FIG. 7 illustrates the variety of pulse shape attributes applied for multi-level PCM cell according to the write-verify programming methodology 100 of FIG. 6.

In one embodiment, as shown in FIG. 7, the pulse shape attribute(s) 70 of programmed one or more second pulse signals 95 applied at a respective BL, e.g., BL<i>, during the time duration T when programming the PCM cell comprises: a pulse amplitude 72, a pulse duration 75 which, as shown from FIG. 5, is shorter in duration than the applied first WL signal, a length of rising edges 76a or trailing edges 76b of the one or more second pulse signals. An adaptable pulse attribute that may be modified further includes a time delay 78 between the BL pulse BL<k>and the next applied BL pulse at the same BL, e.g., BL<k+1>, where "k" is the iteration index, during the time duration T one or more second pulse signals. Referring back to FIG. 5, a further pulse attribute includes the different start time 73 of the applied BL pulse relative to the first applied WL signal within the defined time duration.

Figure 8:
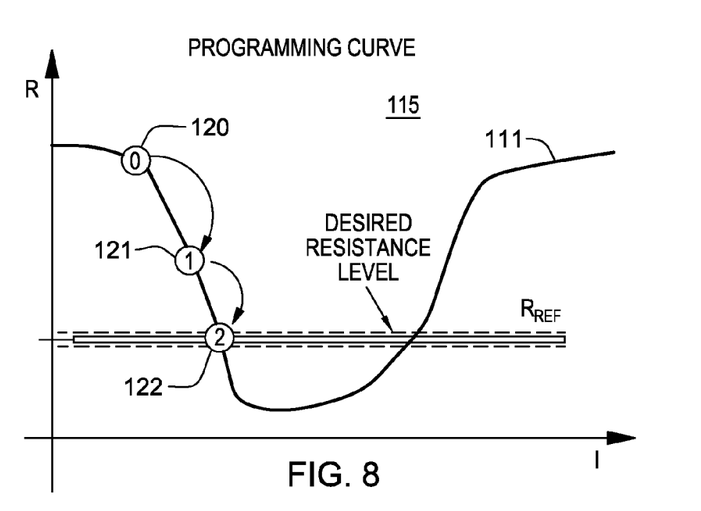
FIG. 8 depicts a plot of a programming curve 110 that is implemented by an algorithm that governs the application of WL and corresponding application of BL pulses with initial resistance in fully RESET state, i.e., highest R value, in an example embodiment.

FIG. 8 depicts a plot 115 of an example programming curve 111 that is implemented by a write-verify algorithm that governs the iterative programming of the target resistance state (R) into the PCM cell, e.g., programming into the desired or target PCM cell resistance state indicated as $R_{REF}$. This programming curve may be tabulated and/or used by iterative write-verify programming to adjust the applied WL voltage or current signal(s) 96, 98 and/or adjust pulse attributes 70 of applied BL pulses at the bit lines relative to the applied WL signals during the time duration T.

Figure 9:
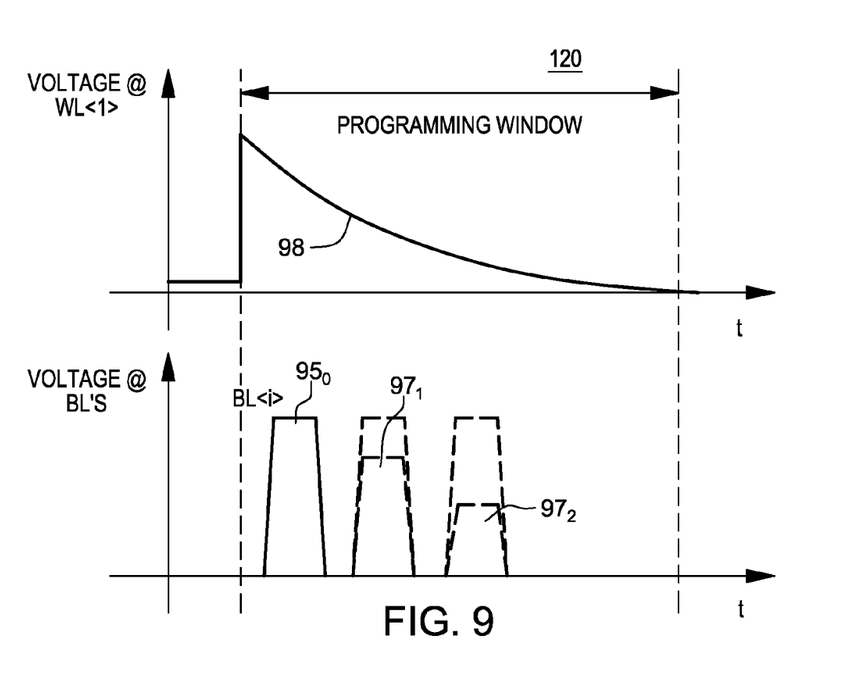
FIG. 9 shows an example programming scheme 120 for the case of initial RESET in which WL pulse is applied to a selected wordline conductor, and a series of pulses (pulse train) is applied to a respective bitline to gradually converge into the desired resistance level.

For example, as shown in FIG. 8, the programming 115 according to the example curve 111 starts at a time corresponding to a PCM cell RESET state, which in one embodiment, may correspond to a respective high PCM cell resistance state. For the example curve shown in FIG. 8, the RESET state includes a high resistance cell state. Initially, a WL ramped signal is applied at a turn-on time (e.g., application of ramped signal 96, FIG. 5), and BL pulse 95 applied to RESET the cell into high resistance state (e.g., an upper bound resistance R) that is shown in FIG. 9 corresponding to point "0" 120 in the curve 111.

One or more additional BL pulses, e.g., a pulse sequence, maybe applied to the respective bit line within the time duration T to gradually converge the cell into the desired resistance level $R_{REF}$, e.g., by additional write-verify programming steps achieving points 121, 122 on the curve 111 labeled "0"→"1"→"2" in FIG. 8. To further improve convergence speed, gain can be adjusted dynamically, e.g., by changing the applied BL pulse amplitude. Thus, as shown in FIG. 9, for the case of initial RESET, WL ramp signal 98 is applied to a selected wordline(s) conductor(s), e.g., WL<1>, and one or more BL are applied to a respective bitline to gradually converge the state of that PCM cell into the desired resistance level, e.g., pulses $95_0$, $97_1$, $97_2$, for the example shown, where a pulse attribute has been modified, e.g., amplitude of successively applied BL pulses decreases, for each successive pulse.

Figure 10:
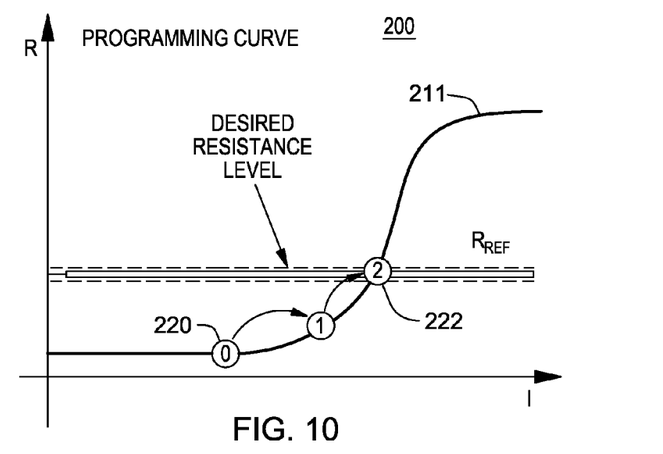
FIG. 10 depicting a plot of an iterative programming curve 200 that is implemented by an algorithm that governs the application of WL and corresponding application of BL pulses with initial resistance in fully SET state, i.e., lowest R value, in another example embodiment.

In a further embodiment, to improve programming accuracy, iterative programming is applied to the parallel programming scheme as shown in FIG. 10 depicting a plot 200 of a programming curve 211 that is programmed into and implemented in the write-verify algorithm that governs the signal generator's application and timing of WL and corresponding application of BL pulses, for example. This programming curve 211 can be used as a guide for adjusting the simultaneously applied WL and BL voltage or current signals.

As shown in FIG. 10, the programming according to the curve 211 starts at a time corresponding to a PCM cell SET state, which in one embodiment, may correspond to a respective low PCM cell resistance state. For the example curve shown in FIG. 10, the SET state is a low resistance state. That is, initially, a WL ramped signal is applied at a turn-on time (e.g., application of ramped signal 96, FIG. 5), and BL pulse 95 is applied to SET the cell into low resistance state (e.g., a lower bound resistance R) that is shown in FIG. 11 corresponding to point "0" 220 in the curve 222.

Figure 11:
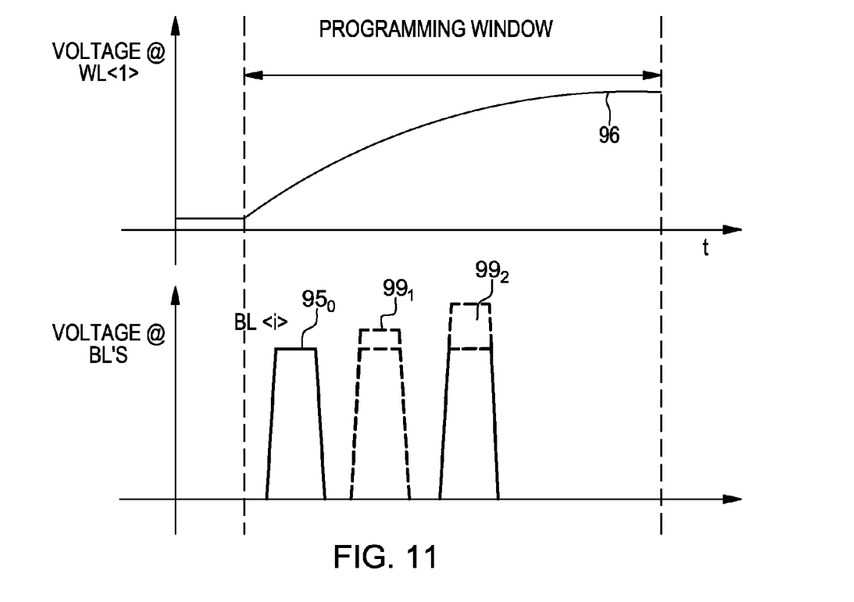
FIG. 11 shows an example programming scheme 220 for the case of initial SET in which WL pulse is applied to a selected wordline conductor, and a series of pulses, (pulse train) is applied to a respective bitline to gradually converge into the desired resistance level.

As shown in FIG. 11, at the beginning of WL turn-on time (e.g., WL pulse 96, FIG. 9), a BL pulse is applied to SET the cell into Low resistance state (R lower bound) corresponding to point "0" in the curve 211 shown. To further improve convergence speed, gain is adjusted dynamically by changing the BL amplitude according to the applied write-verify technique. Thus, as shown in FIG. 11, for the case of initial SET, WL pulse 96 is applied to a selected wordline conductor, e.g., WL<1>, and a series of pulses, e.g., pulse sequence, is applied to a respective bitline to gradually converge into the desired resistance level, e.g., by applied pulses $95_0$, $99_1$, $99_2$, for the example shown. As shown in FIG. 9, the amplitude of BL increases for each successive pulse to converge upon the target PCM resistive state indicated along the curve at 222.

As aforementioned herein with respect to FIG. 4, a WL pulse generation circuitry 67 device and BL pulse generation circuitry 68 are provided that applies the pulses for charging the respective word line (WL) and bit lines according to the algorithm that governs the application of WL and corresponding application of BL pulses as described herein. For example, WL and BL circuits 67, 68 may include a pulse signal generator, e.g., a clock waveform generator, separate controller element implementing control logic, and a loop including DACs and ADCs. Depending on whether the applied WL signal is ramping up or down, resistance can increase or decrease at each iteration and a separate control such that each iteration may be input to a loop including DAC, ADC as controlled by programmed control logic.

In the programming approach, each bit of the MLC may be accomplished by an iterative method, such as described herein with respect to FIG. 6, whereby the BL circuit 68 applies a programmed (pulse timing and amplitude) to adaptively program the characteristic parameter (e.g., a resistance state) of an individual bit of the MLC PCM cell method after being initialized into "SET" or "RESET" state by the respective wordline. That is, the circuits 67, 68 parallel programming is efficiently achieved by applying WL signal at multiple word lines, and pulsing many BL's independently at different starting time points, with the starting time dependent on target resistance level to be programmed, and generally, different pulse shape attributes.

In one embodiment, an energy-efficient row driver circuit such as described in corresponding U.S. patent application Ser. No. 13/335,155, the whole contents and disclosure of which is incorporated by reference as if fully set forth herein, may be used to program the MLC in parallel in a more energy efficient and accurate manner. This row driver circuit utilizes an adiabatic computing approach that saves power and enables very long wordlines for parallel programming to build efficient large arrays such as the apparatus 80 of FIG. 4.

While a design methodology of achieving high programming bandwidth for MLC PCM is described, it is understood that the voltage ramp rates, rise times, fall times, WL durations and BL pulse attribute parameters described herein to achieve the PCM programming states are all detailed design parameters that may change based on and determined by the particular implementation.

While this disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for parallel programming each of a plurality of phase change memory (PCM) cells of an array of PCM cells, each said memory cell of said plurality of cells being programmed having a respective first and second terminal, said array of PCM cells including a plurality of rows of conductors and plurality of columns of conductors, each row conductor of said plurality connecting a respective plurality of PCM cells at a respective first terminal, and each respective column conductor of said plurality connecting a respective PCM cell of said plurality at a respective second terminal, the method comprising:

simultaneously applying, at two or more row conductors of said array, a first signal of a defined time duration, to the first terminal of each respective memory cell of the plurality of memory cells being parallel programmed; and, iteratively applying, at two or more column conductors of said array during said defined time duration, second pulse signals at each respective second terminal of each respective memory cell of the plurality of memory cells being parallel programmed, wherein at each iteration, adaptively controlling an attribute of each said second pulse signals applied at each respective second terminal, said adaptively controlled attribute of applied second pulse signals comprises: a pulse amplitude, a pulse duration, a length of rising or trailing edges of one or more said second pulse signals and a time delay between one or more said second pulse signals;

wherein at each said programmed cell of said array, said simultaneous application of said first signal and said iteratively applied second pulse signals at respective said first and second memory cell terminals during said defined time duration configuring a target characteristic parameter to achieve one or more programmed states at the respective memory cell.

2. The method of claim 1, wherein storing a characteristic parameter in the memory cell includes performing iterative programming technique that recursively stores the characteristic parameter in a memory cell.

3. The method of claim 1, wherein each PCM cell includes a word line access device connecting each said first terminal of each respective memory cell, said first signal applied to said word line access device of each PCM cell to control current through said PCM cell when programming the plurality of memory cells.

4. The method of claim 3, wherein said first signal applied to said common conductor is a signal that decreases in amplitude for the defined time duration, or is a signal that increases in amplitude for the defined time duration.

5. The method of claim 4, wherein each pulse of second pulse signals is shorter in duration than said applied first signal.

6. The method of claim 3, wherein a second pulse signal of said sequence is applied at a different start time relative to said applied first signal within said defined time duration.

7. The method of claim 1, wherein a first pulse of said one or more second pulses applied to said second terminal of each said PCM cell places each said PCM cell in an initial resistive state, said iterative programming comprising:

iteratively applying remaining one or more second pulses within said defined time duration having said pulse shape attributes that when applied in conjunction with said first signal, gradually converge a resistance value of said memory cell into a desired resistance level.

8. The method of claim 7, further comprising dynamically adjusting said pulse shape attribute of each said second pulse of said sequence to further improve a convergence speed.

9. The method of claim 6, wherein said initial resistive state is one of: a highest electrical resistance state or a lowest electrical resistance state.

10. A system for parallel programming a bit value in each of a plurality of phase change memory (PCM) cells of an array of PCM cells, each individual PCM memory cell of said plurality of cells being programmed having first and second terminals, said array of PCM cells including a plurality of rows of conductors and plurality of columns of conductors, each row conductor of said plurality connecting a respective plurality of PCM cells at a respective first terminal, and each respective column conductor of said plurality connecting a respective PCM cell of said plurality at a respective second terminal, the system comprising:
a first signal generator device for simultaneously applying, at two or more row conductors of said array, a first signal of a defined time duration, to the first terminal of each respective memory cell of the plurality of memory cells being parallel programmed; and,
a second signal generator device for iteratively applying, at two or more column conductors during said defined time duration, second pulse signals at each respective second terminal of each respective memory cell of the plurality of memory cells being programmed, said second signal generator device configured to adaptively control an attribute of each said second pulse signals at each iteration, said adaptively controlled attribute of said second pulse signals applied at a respective memory cell comprising: a pulse amplitude, a pulse duration, a length of rising or trailing edges of one or more said second pulse signals and a time delay between one or more said second pulse signals;
wherein at each said programmed cell of said array, said simultaneous application of said first signal and said iteratively applied second pulse signals at respective said first and second memory cell terminals during said defined time duration configure a target characteristic parameter to achieve a one or more programmed states at the respective memory cell.

11. The system of claim 10, further comprising: a control device for controlling said first signal generator device to apply the first signal and for controlling said second signal generator device to iteratively apply said second pulse signals for achieving said characteristic parameter in the memory cell, said control device performing an iterative programming technique that recursively stores the characteristic parameter in a memory cell.

12. The system of claim 10, wherein each PCM cell includes a word line access device connecting each said first terminal of each respective memory cell, said first signal applied to said word line access device of each PCM cell to control current through said PCM cell when programming the plurality of memory cells.

13. The system of claim 10, wherein said first signal applied to said common conductor is a signal that decreases in amplitude for the defined time duration, or is a signal that increases in amplitude for the defined time duration.

14. The system of claim 10, wherein each pulse of said one or more second pulse signals are shorter in duration than said applied first signal.

15. The system of claim 10, wherein a second pulse signal is applied at a different start time relative to said applied first signal within said defined time duration.

16. The system of claim 11, wherein a first pulse applied to said two or more row conductors places connected said memory cells in an initial resistive state, said
iteratively applying second pulses at said two or more column conductors at each iteration within said defined time duration having said adaptively controlled pulse shape attributes gradually converge a resistance value of each said memory programmed cell into a desired resistance level.

17. The system of claim 16, wherein said control device further performs:
dynamically adjusting said pulse shape attribute of each said second pulse to further improve a convergence speed.

18. The system of claim 16, wherein said initial resistive state is one of: a highest resistance state or a lowest resistance state.

* * * * *